United States Patent [19]
Shiraishi

[11] Patent Number: 6,077,348
[45] Date of Patent: Jun. 20, 2000

[54] SINGLE CRYSTAL PULLING APPARATUS, SINGLE CRYSTAL SUPPORT MECHANISM, AND SINGLE CRYSTAL PULLING METHOD

[75] Inventor: Yutaka Shiraishi, Annaka, Japan

[73] Assignee: Super Silicon Crystal Research Institute Corp., Gunma, Japan

[21] Appl. No.: 09/037,516

[22] Filed: Mar. 10, 1998

[30] Foreign Application Priority Data

Mar. 31, 1997 [JP] Japan ................... 9-096783

[51] Int. Cl.[7] ................... C30B 35/00
[52] U.S. Cl. ............ 117/218; 117/217; 117/911
[58] Field of Search ................... 117/217, 218, 117/219, 911

[56] References Cited

U.S. PATENT DOCUMENTS

| | | | |
|---|---|---|---|
| 4,367,199 | 1/1983 | Jericho | 117/218 |
| 4,738,832 | 4/1998 | Drechel | 117/218 |
| 5,843,226 | 12/1998 | Kimura et al. | 117/216 |
| 5,879,448 | 3/1999 | Urang et al. | 117/13 |
| 5,882,397 | 3/1999 | Iino et al. | 117/13 |

FOREIGN PATENT DOCUMENTS

| | | |
|---|---|---|
| 62-288191 | 12/1987 | Japan . |
| 63-252991 | 10/1988 | Japan . |
| 3-285893 | 12/1991 | Japan . |
| 3-295893 | 12/1991 | Japan . |
| 4-321583 | 11/1992 | Japan . |
| 5-270968 | 10/1993 | Japan . |
| 5-270974 | 10/1993 | Japan . |
| 5-270975 | 10/1993 | Japan . |
| 5-270976 | 10/1993 | Japan . |
| 7-172981 | 7/1995 | Japan . |
| 9-002893 | 1/1997 | Japan . |

*Primary Examiner*—Felisa Hiteshew
*Attorney, Agent, or Firm*—McDermott, Will & Emery

[57] ABSTRACT

The object of the present invention is to achieve reliable and safe pulling operation of a single crystal having large diameter and heavy weight in a chamber with reduced pressure. According to the present invention, a constricted portion is formed under a seed crystal, and a single crystal is pulled up by supporting the constricted portion, and a support base 30 is used, which has an opening 22, serving as a through-hole, and a slit 34, which leads from the opening to outer periphery of the support base, and a portion with larger diameter of the constricted portion is supported from below in linear contact manner. The support base 30 further comprises a recess 32, which leads to the opening 22, and it can be designed and selected to have such configuration as to suit the shape of the constricted portion. The support base 30 can be moved between a non-support position and a support position by operating a moving unit. The driving unit of the seed crystal lift mechanism and the driving unit of the support base moving mechanism are accommodated in an accommodation container 10a, and a mechanism for moving up and down the accommodation container may be provided.

15 Claims, 6 Drawing Sheets

SINGLE CRYSTAL PULLING APPARATUS, SINGLE CRYSTAL SUPPORT MECHANISM, AND SINGLE CRYSTAL PULLING METHOD

BACKGROUND OF THE INVENTION

1. Field of the Invention

The present invention relates to a single crystal growing apparatus and a single crystal growing method for manufacturing a dislocation-free single crystal of silicon by the pulling Czochralski method.

2. Description of the Prior Art

In a single crystal manufacturing apparatus based on the pulling Czochralski (CZ) method, fresh argon (Ar) gas is supplied into a highly pressure-proof airtight chamber where pressure is reduced to about 10 torr in advance and polycrystal in a quartz crucible arranged in the lower portion of the chamber is melted by heating. Then, a seed crystal is immersed into surface of the melt from above, and by rotating and moving up and down the seed crystal and the quartz crucible, the seed crystal is pulled up. As a result, a single crystal (the so-called ingot) is grown, which comprises an upper cone portion with its upper end protruding, a cylindrical body portion, and a lower cone portion with its lower end protruding, all under the seed crystal.

As a method to grow as described above, Dash method is known. According to this method, in order to eliminate dislocation (i.e. in order to turn to dislocation-free), which occurs in the seed crystal due to thermal shock when the seed crystal is immersed to the surface of the melt, pulling rate is relatively increased after immersing the seed crystal to the surface of the melt so that a neck portion having smaller diameter than the seed crystal, e.g. 3 to 4 mm, is formed, and pulling of the upper cone portion is started.

Further, a single crystal having large diameter and heavy weight (150 to 200 kg or more) cannot be pulled up via the neck portion with small diameter, and a method has been proposed, for example, in JP-B-5-65477. According to this method, a neck portion with small diameter is formed by Dash method, and the pulling rate is then relatively slowed down and a portion with larger diameter is formed. Then, the pulling rate is relatively increased, and a portion with small diameter is formed. Thus, a "spherical constricted portion" is formed, and by gripping this constricted portion with a gripper, the single crystal having large diameter and heavy weight is pulled up. Also, a conventional type apparatus for gripping the constricted portion is proposed, for example, in JP-B-7-103000 and JP-B-7-515.

As other conventional examples, a method for directly gripping a body portion with a "constricted portion" as described above has been proposed, for example, in JP-A-5-270974 or JP-A-7-172981. Also, a method to form a "ring-like constricted portion" having a larger diameter than the body portion between the upper cone portion and the body portion instead of the above "spherical constricted portion" and to grip this "ring-like constricted portion" has been proposed in JP-A-63-252991 and JP-A-5-270975.

However, in each of the conventional type gripping members as described above, there are problems in that it is not very practical to use a gripper and a power transmission mechanism to suspend a single crystal having large diameter and heavy weight (e.g. with a body portion of 400 mm in diameter and 400 kg in weight) in a chamber where pressure is reduced to about 10 torr using vacuum pump. If the single crystal is detached from the gripper and is dropped down, dislocation may occur, and the single crystal is not qualified as a product any more. When the quartz crucible is damaged, high temperature melt may react in the worst case with the cooling water inside the crucible shaft, which rotates and moves up and down the quartz crucible, and vapor explosion may occur.

SUMMARY OF THE INVENTION

To solve the above problems, it is an object of the present invention to provide a single crystal pulling apparatus, a single crystal support mechanism, and a single crystal pulling method, by which it is possible to pull a single crystal having large diameter and heavy weight in a chamber with reduced pressure in reliable and safe manner.

To attain the above object, according to the apparatus and the method of the present invention, a constricted portion is formed under a seed crystal, and when a single crystal is pulled by supporting this, a portion with larger diameter of the constricted portion is supported from below on linear contact basis using a support base provided with a through-hole and a slit leading from the through-hole to outer periphery of the support base.

According to the present invention, there is provided a single crystal pulling apparatus for manufacturing a semiconductor single crystal by pulling CZ (Czochralski) method, comprising:

a seed crystal lift mechanism for holding and moving a seed crystal up and down; and a single crystal support mechanism for supporting a constricted portion of a single crystal formed under said seed crystal, whereby:

said single crystal support mechanism comprises a support base for supporting a portion with larger diameter of said constricted portion from below in linear contact basis, having a through-hole to receive and pass said constricted portion and also having a slit for communicating said through-hole with outer peripheral portion of said support base to guide said constricted portion toward said through-hole.

According to the present invention, there is also provided a single crystal pulling method for manufacturing a semiconductor single crystal by pulling CZ method, whereby said method comprises the steps of:

immersing and adapting a seed crystal into a melt in a quartz crucible by a seed crystal lift mechanism;

forming a neck portion of the single crystal under said seed crystal by pulling said seed crystal using said seed crystal lift mechanism;

increasing diameter of said single crystal by controlling the pulling rate induced by said seed crystal lift mechanism to grow a spherical portion of the single crystal under said neck portion;

reducing diameter of said single crystal by controlling the pulling rate induced by said seed crystal lift mechanism to form a constricted portion under a spherical portion of said single crystal;

moving said support base in a direction approximately perpendicular to the axis of said constricted portion so that, using a support base having a through-hole to receive and pass said constricted portion and having a slit for communicating said through-hole with outer peripheral portion of said support base, said constricted portion is positioned in said through-hole via said slit; and forming a body portion of the single crystal under the portion with larger diameter of said constricted portion by pulling said support base in synchronization with said seed crystal lift mechanism.

BRIEF DESCRIPTION OF THE DRAWINGS

The above-mentioned objects and features will become more readily apparent from the following description of the embodiment taken in conjunction with the accompanying drawings in which.

DESCRIPTION OF THE PREFERRED EMBODIMENTS

Figure 1:
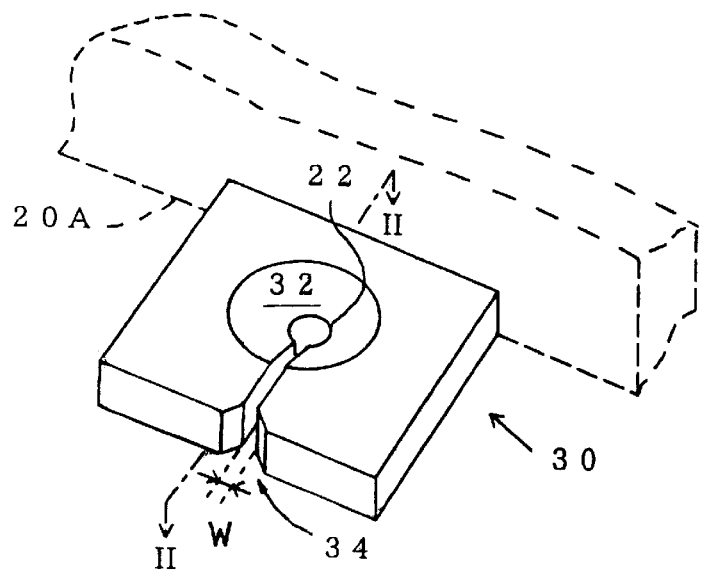
FIG. 1 is a perspective view of a support base of a single crystal support mechanism in an embodiment of the present invention.
Figure 2:
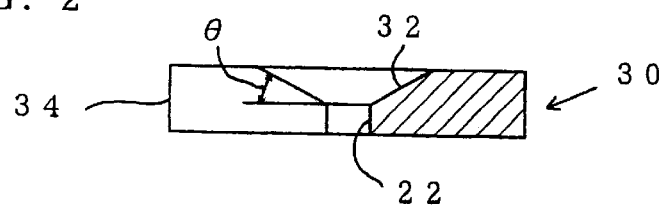
FIG. 2 is a cross-sectional view as seen from the right in FIG. 1 along the line II—II in FIG. 1.
Figure 3:
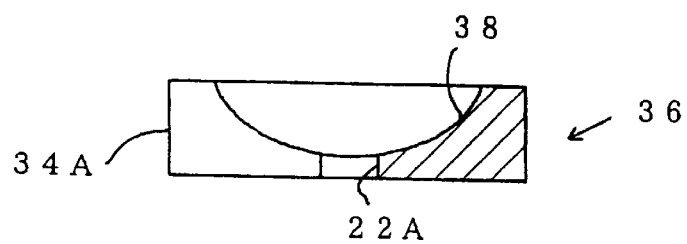
FIG. 3 is a cross-sectional view of another example of the support base of the single crystal support mechanism in the embodiment of the present invention.
Figure 4:
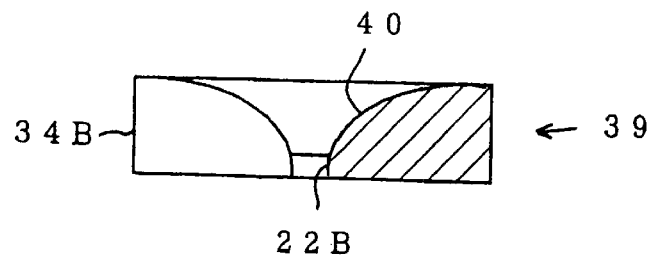
FIG. 4 is a cross-sectional view of still another example of the support base of the single crystal support mechanism of the embodiment of the present invention.
Figure 5:
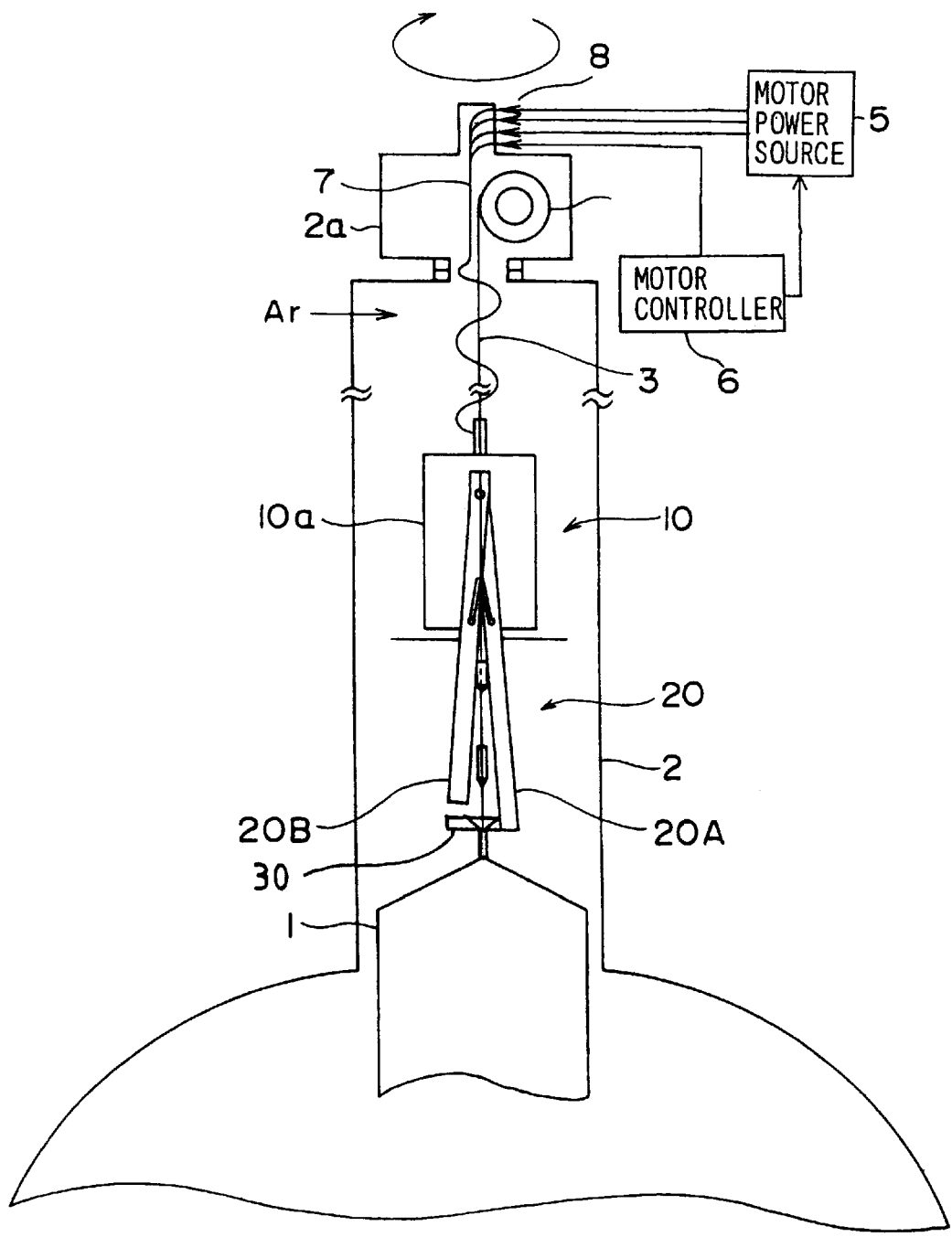
FIG. 5 is a lateral sectional view of an essential portion of an embodiment of a semiconductor single crystal pulling apparatus according to the present invention.
Figure 6:
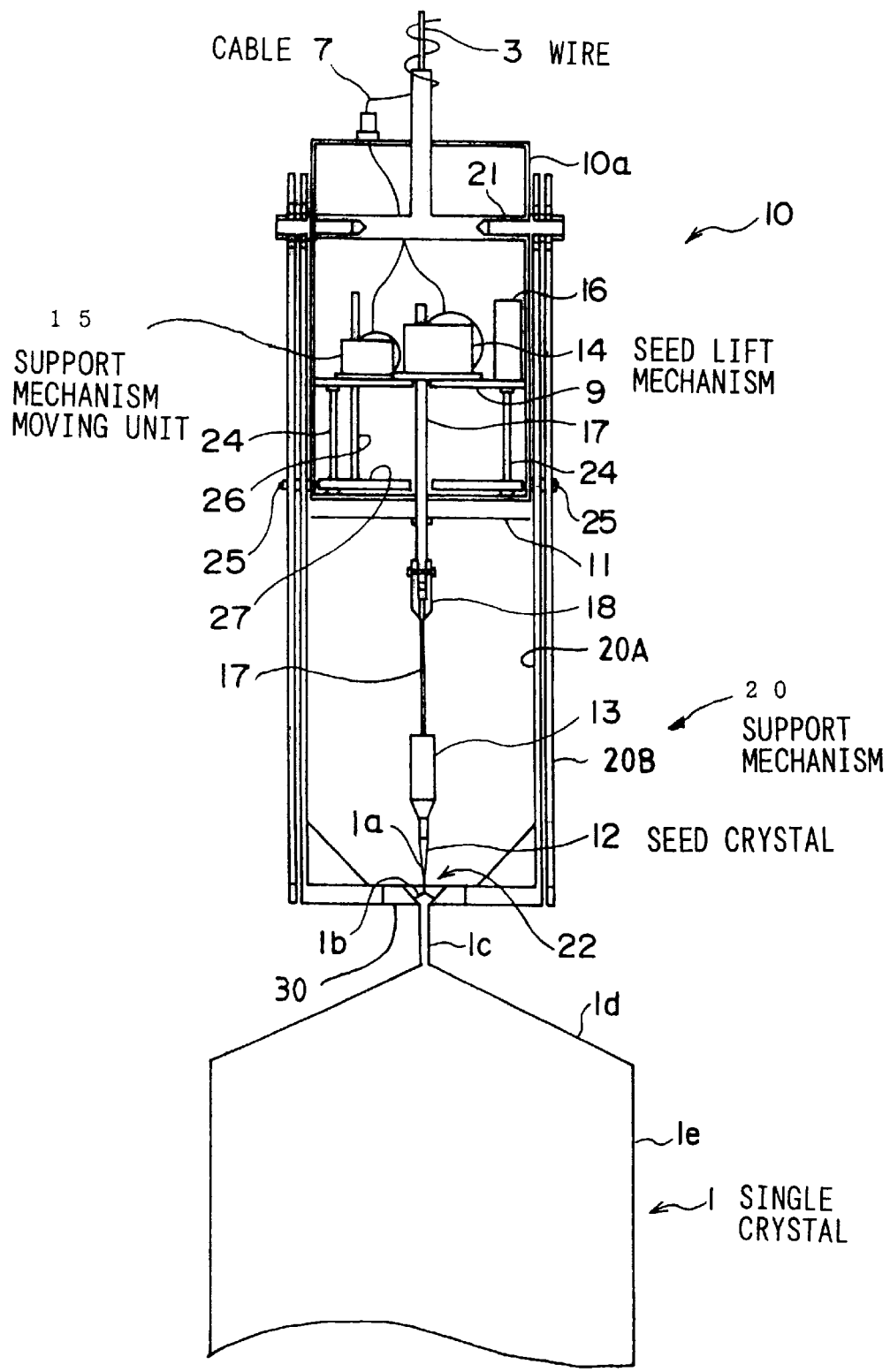
FIG. 6 is an enlarged sectional view seen from front side, showing details of the single crystal holding device of FIG. 5.
Figure 7:
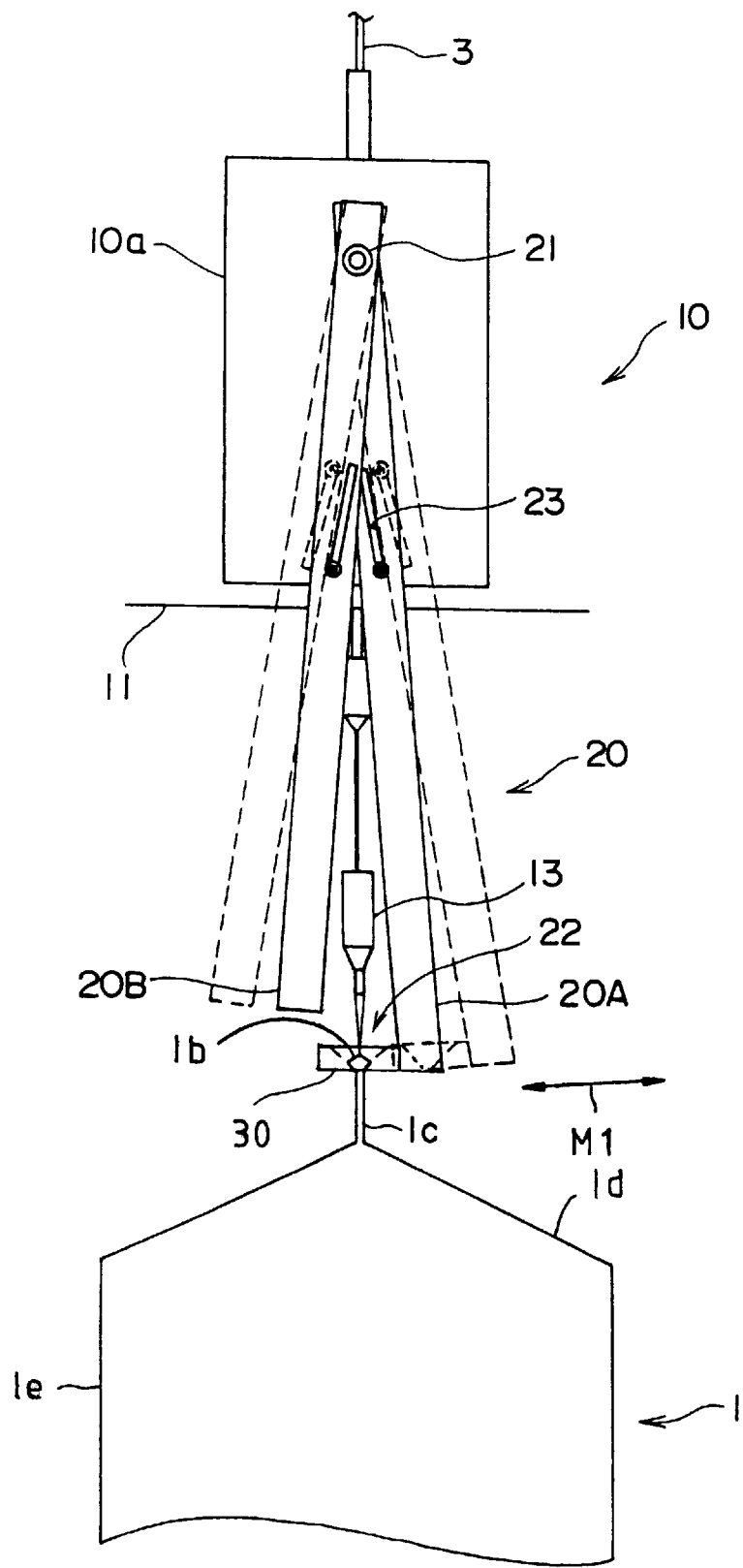
FIG. 7 is a side view of the single crystal holding device of FIG. 6.

In the following, description will be given on the preferred embodiments of the present invention referring to the attached drawings. FIG. 1 is a perspective view showing an essential part of a single crystal support mechanism in an embodiment of a single crystal pulling apparatus of the present invention; FIG. 2 is a cross-sectional view of a part shown by solid line in the essential part of FIG. 1; FIG. 3 and FIG. 4 each represents a variation of the above embodiment in cross-sectional view; FIG. 5 is a lateral sectional view showing an essential part of the embodiment; FIG. 6 is an enlarged frontal sectional view showing the single crystal holding apparatus of FIG. 5 in detail; and FIG. 7 is a side view showing the single crystal support mechanism of FIG. 6.

FIG. 5 is a lateral sectional view schematically showing an essential part of a single crystal pulling apparatus for pulling a single crystal 1 in a chamber 2. A single crystal holding apparatus 10 is suspended by a wire 3 in the upper portion of the chamber 2, and the wire 3 is wound up by a wire winding drum 4 and a wire winding motor (not shown). The wire winding drum 4 and the like are arranged in a drum accommodation unit 2a above the chamber 2. The drum accommodation unit 2a is rotatably mounted with respect to the chamber 2. Therefore, the single crystal holding apparatus 10 is rotated when the drum accommodation unit 2a is rotated, and it is moved up and down by operating the wire 3 and the wire winding drum 4.

From a motor power source 5 and a motor controller 6 provided outside the chamber, power and motor control signals are sent to the single crystal holding apparatus 10 via power and control cables 7 respectively, and the power and control cables 7 are connected to the motor power source 5 and the motor controller 6 via slip rings 8 arranged on the drum accommodation unit 2a so that the cables may not be twisted even when the single crystal holding apparatus 10 is rotated in rotating direction shown by the arrow in FIG. 5. Although not shown in the figure, a quartz crucible, a mechanism to rotate and lift it, and a heater for heating the quartz crucible are arranged under the chamber 2.

Next, detailed description will be given on an arrangement of the single crystal holding apparatus 10 referring to FIG. 6 and FIG. 7. The single crystal holding apparatus 10 comprises a heat-insulation container 10a in cylindrical shape, and a pair of grippers 20 disposed on the lower portion of the heat-insulation container 10a to grip the single crystal 1. A heat shielding plate 11 is mounted on the lower portion of the heat-insulation container 10a. These members and components are made of materials such as graphite, ceramics, molybdenum, carbon, etc.

Also, in order to cool inside the heat-insulation container 10a, it is desirable to arrange cooling fins (not shown) outside the wall of the heat-insulation container 10a, to provide solid cooling elements such as Peltier element inside the heat-insulation container 10a, or to provide a means for guiding the gas outside the heat-insulation container 10a into the heat-insulation container 10a. Also, in order to increase heat-insulation effect of the heat-insulation container 10a, a material with low thermal conductivity, e.g. a ceramic material, may be attached on inner side of the wall of the heat-insulation container 10a.

Inside the heat-insulation container 10a, there are provided a seed lift mechanism 14 for moving up and down a seed crystal holder 13 for holding the seed crystal (seed) 12, a support mechanism moving unit 15 for moving a support base to be described later of a support mechanism 20 between two positions shown by broken lines and solid lines, and a balance weight 16. These are provided on a base plate 9 mounted inside the heat-insulation container 10a, and a guide rail 24 extending downward from the base plate 9 is mounted. Internal structures of the seed lift mechanism 14 and a support mechanism moving unit 15 are not shown in the figure, while each of these mechanisms comprises a seed lifting motor, a support mechanism moving motor, and a gear mechanism. The seed crystal holder 13 is mounted on the lower end of a connecting shaft 17, and a gear unit provided at the upper end of the connecting shaft 17 is engaged with a gear mechanism in the seed lift mechanism 14. Therefore, when the seed lifting motor in the seed lift mechanism is rotated, the connecting shaft 17 and the seed crystal holder 13 are moved up and down.

The upper ends of two arms 20A and 20B of the support mechanism 20 are mounted in such manner that these can be rotated around a shaft 21 arranged at upper position of the heat-insulation container 10a, and a support base 30 designed in planar shape as a whole is removably mounted on the lower end of the arm 20A. On the support base 30, a recess 32 and an opening 22 are provided to support a portion with larger diameter of a constricted portion of the single crystal 1 from below in linear contact manner. A slit 23 is formed near the center of each of the two arms 20A and 20B. A gear mechanism in the support mechanism moving unit 15 is engaged with a gear unit formed at the upper end of a rod 26, and a movable plate 27 mounted at the lower end of the rod 26 is moved up and down along a guide rail 24. In FIG. 7, the two arms 20A and 20B are rotated in response to upward or downward movement of the movable plate 27 to be described later. Solid lines indicate the closed state, and broken lines indicate the opened state. The arm 20B serves as a counterbalance weight to the arm 20A, and it constitutes a balance element to prevent deviation of the support mechanism due to rotation of the arm at the position before being supported by the support base 30.

Figure 8:
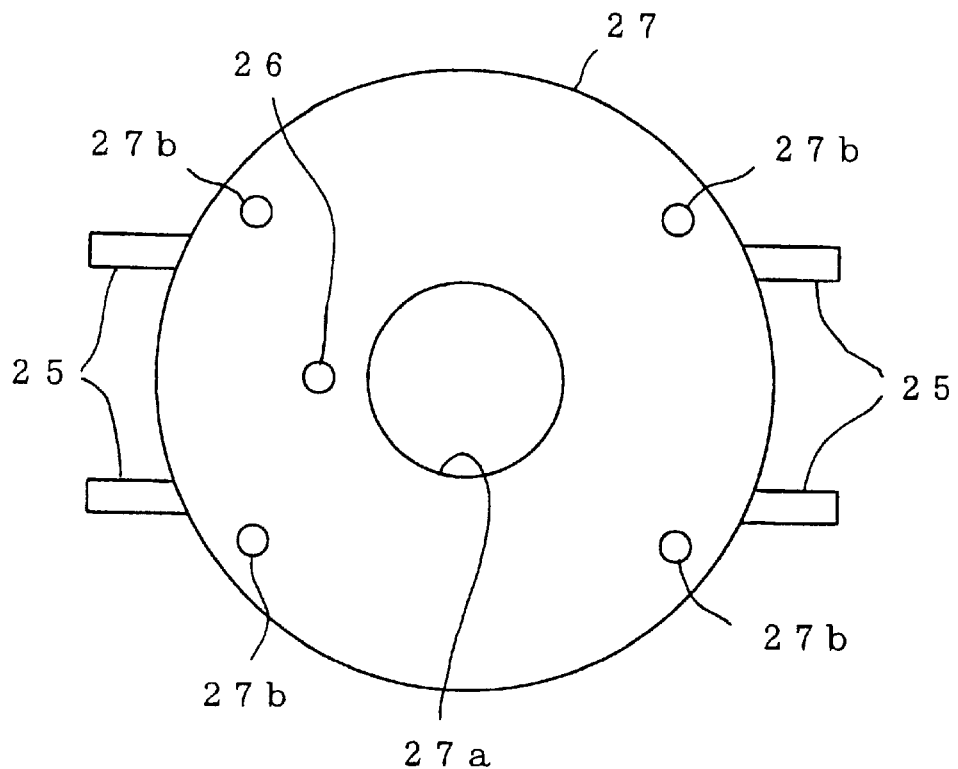
FIG. 8 is a plan view of a movable plate in FIG. 6.

FIG. 8 is a plan view of the movable plate 27. On the movable plate 27, there are provided a center hole 27a to receive a connecting shaft 17 and four holes to allow the guide rails 24 to pass through. Further, four bosses 25 extending outward are arranged, and these bosses 25 are engaged in four slits 23 of the two arms 20A and 20B. Therefore, when the support mechanism moving motor in the support mechanism moving unit 15 is rotated and the rod 26 is moved upward, the movable plate 27 is moved up. Then, the bosses 25 are moved up along the slits 23. When the bosses are engaged with the upper ends of the slits 23, the support base mounted on the lower end of the arm 20A is moved to a position shown by broken line in FIG. 7 (non-support position). On the other hand, when the rod 26 is moved downward, the movable plate 27 is moved down. Then, the bosses 25 are moved down along the slits 23 and engaged with the lower ends of the slits 23, and the support base 30 is moved to a position shown by solid lines (support position).

Figure 9:
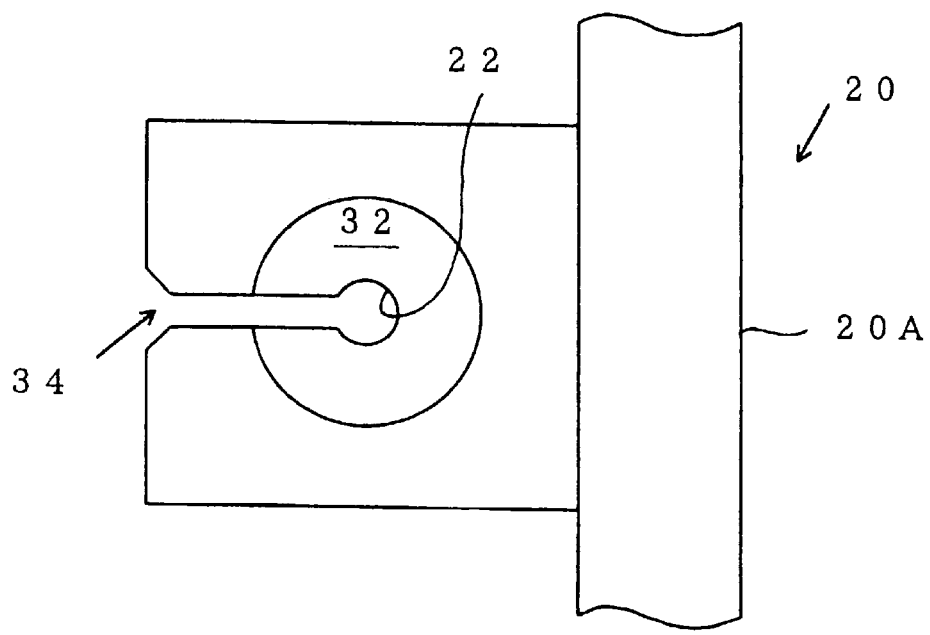
FIG. 9 is a plan view of the support base mounted on an arm as a support mechanism in FIG. 7.
Figure 10:
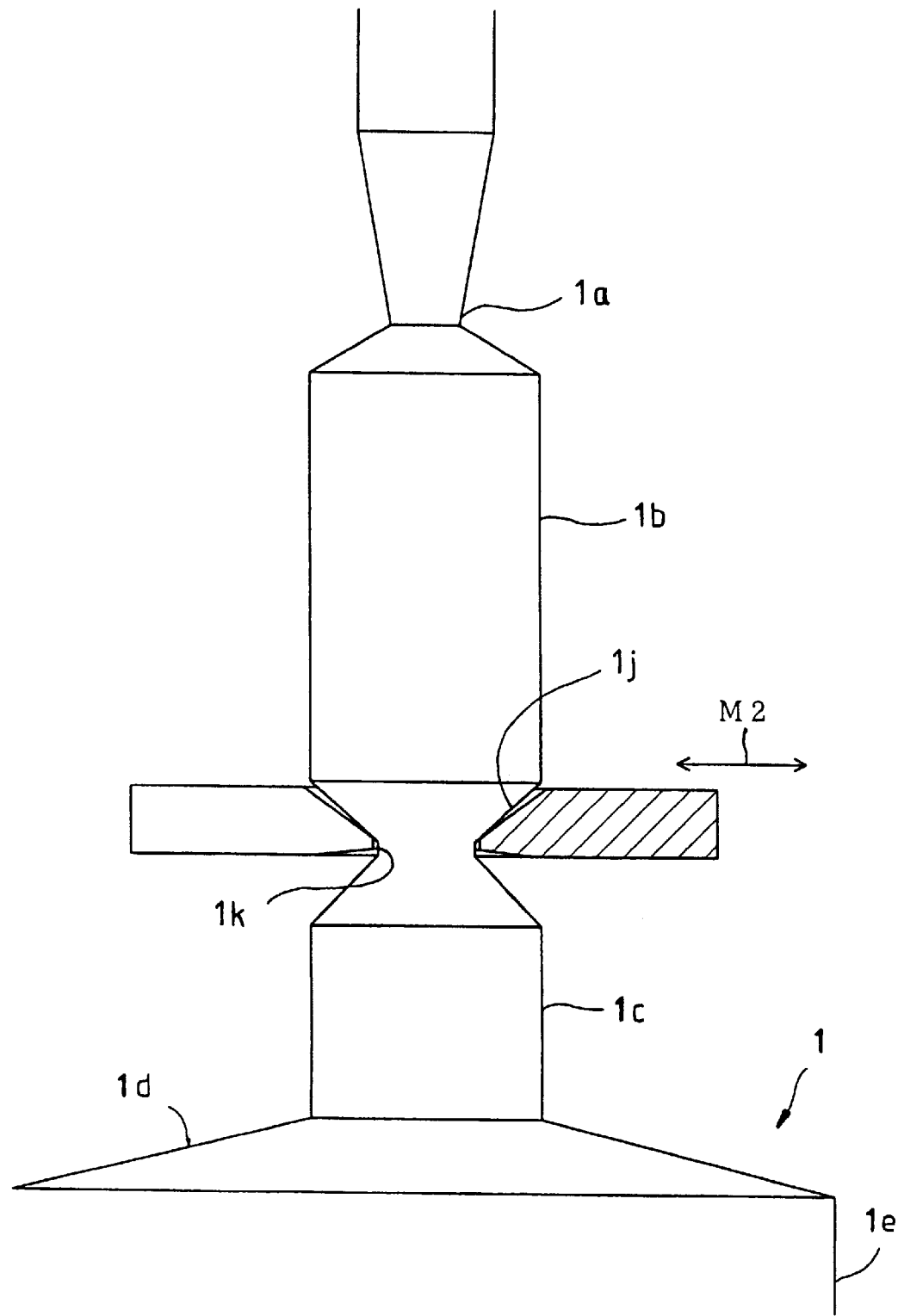
FIG. 10 is a diagram to explain supporting of the constricted portion of the single crystal by the support base shown in FIGS. 1, 2 and 9.

FIG. 1 is a perspective view of the support base 30. FIG. 2 is a cross-sectional view along the line II—II of FIG. 1 and seen from the right in FIG. 1, and FIG. 9 is a plan view of the support base 30 and its surrounding. FIG. 10 is a cross-sectional view showing how the support base 30 supports the constricted portion of the single crystal. As shown in FIG. 10, the constricted portion consists of a narrow portion 1k and portions with larger diameter above and below, and an inclined portion 1j leading from the narrow portion 1k to the upper portion with larger diameter 1b is supported in linear contact manner. As shown in FIG. 1 and FIG. 2, the support base 30 is designed in flat planar shape as a whole, and an opening 22, serving as a through-hole, is provided approximately at the center, and a recess 32 leading to the opening is formed on the upper surface. The recess comprises an inclined beveled portion with thickness getting thinner toward the opening 22 and designed in tapered form. Also, the opening 22 is opened and leading to outer periphery of the support base 30 via a slit 34. That is, the support base 30 is penetrated from upper surface to lower surface via the opening 22 and the slit 34 connected with the opening.

As shown in FIG. 2, the angle θ formed between the inclined surface of the recess 32 in tapered form and the flat lower surface of the support base 30 (i.e. a plane running in a direction perpendicular to axial direction of the opening 22) is several tens of degrees. It is preferable that this tilt angle θ is between 10° and 70° and can be adequately changed according to the shape of the constricted portion. To achieve such a change, it may be designed in such manner that the support base 30 is removably mounted on the arm 20A and two or more support bases 30 with different tilt angles are prepared in advance, and the most suitable support base can be used for each case.

FIG. 3 is a cross-sectional view of a support base 36 with a recess of different shape. As it is evident from comparison with FIG. 2, the support base 36 of FIG. 3 has a recess 38 with cross-section in shape of curved dome. Because the recess 38 is deeper than the recess of FIG. 2, the support base 36 is designed thicker. An opening 22A and a slit 34A are provided in the same manner as in FIG. 1 and FIG. 2. FIG. 4 is a cross-sectional view of a support base 39, which has a recess of different shape. As it is evident from comparison with FIG. 3, the support base 39 of FIG. 4 has a recess 40, which is curvilinear in cross-section but is inverted. An opening 22B and a slit 34B are provided in the same manner as in FIG. 2 and FIG. 3.

The arm 20A is moved, i.e. it is swung, as shown by an arrow M1 in FIG. 7, and it can be moved between a first position shown by broken line where the support base 30 is deviated from under the inclined portion 1j (leading to the portion with larger diameter 1b above the constricted portion) and a second position shown by solid line where the support base is positioned under the portion with larger diameter 1b above the constricted portion. The support base 30 is moved as shown by an arrow M2 in FIG. 10. When the support base is moved from the first position (non-support position) to the second position (support position), the support base 30 is guided through the slit 34 shown in FIG. 1 and FIG. 2 to the opening 22 in such manner that the constricted narrow portion 1k does not come into contact with the support base 30. Therefore, the width W of the slit 34 must be designed larger than the diameter of the constricted narrow portion 1k. Also, the width W of the slit 34 must be designed as sufficiently smaller than the diameter of the portion with larger diameter 1b so that the inclined portion 1j can be effectively supported.

The material and the size of the two arms 20A and 20B and the support base 30 must be selected in such manner that these can be resistant to high temperature and can endure the weight of the single crystal to be pulled up, e.g. 600 kg. As an example, it is preferable that the arm 20A is about 20 mm in width, about 8 mm in thickness, and about 600 mm in length, and that the support base 30 is 20 to 30 mm in thickness. Graphite, molybdenum, stainless steel, carbon fiber, ceramics, etc. may be used as the material.

When the single crystal 1 is manufactured under the above arrangement, pressure in the chamber 2 is reduced to about 10 torr, and fresh argon gas is supplied. At the same time, a polycrystal in the quartz crucible arranged under the chamber 2 is heated and melted, and the single crystal holding apparatus 10 and the quartz crucible are rotated. The single crystal holding apparatus 10 is moved by operating the wire winding drum 4 with the support mechanism 20 in opened state so that the seed crystal 12 is immersed into the surface of Si melt in the quartz crucible under the chamber 2 while it does not come into contact with the lower end of the support mechanism 20, i.e. the support base 30 and the like, and the seed crystal 12 is moved down by operating the seed lift mechanism 14. Next, after a predetermined time has elapsed, the seed crystal 12 is pulled up at relatively high pulling rate, and a neck portion 1a with small diameter (3 to 4 mm) is formed under the seed crystal 12. Then, the pulling rate is relatively slowed down and a portion with lager diameter is formed. The pulling rate is then relatively increased, and a spherical (FIG. 6 and FIG. 7) or a cylindrical (FIG. 1) portion with larger diameter 1b is formed under the neck portion 1a, and a constricted portion 1k is formed thereunder.

Next, a second neck portion 1c having such a diameter that it can endure the weight of the single crystal 1 is formed under the constricted narrow portion 1k. By controlling the height level of the single crystal holding apparatus and the height level of the seed crystal 12, the support base 30 at the lower end of the support mechanism 20 is moved to the second position by operating the support mechanism moving unit 15 to support the inclined portion 1j. When the inclined portion 1j is supported by the support mechanism 20, the single crystal holding apparatus 10 is moved up, and by gradually slowing down the pulling rate, the upper cone portion 1d is formed. Then, by pulling up at a constant rate, a cylindrical body portion 1e is formed. During pulling operation, the quartz crucible is moved up in such manner that the surface of the Si melt is kept at constant level.

A mechanism is provided for winding up the power cable and/or the cable for control signal for the seed lift mechanism 14 and the single crystal support mechanism moving unit 15 in synchronization. It is preferable to have such an arrangement that the power cable and the cable 7 for control signal are wound up in synchronization with the rotation of the wire winding drum 4 for winding up the wire, which suspends the single crystal holding apparatus 10.

As described above, according to the present invention, it is designed in such manner that the single crystal is supported by the support base having an opening and a slit to support the portion with larger diameter from below in linear contact manner, and this makes it possible to support the single crystal having large diameter and heavy weight in reliable and safe manner. In particular, the single crystal is not held by a squeezing system, i.e. by applying some force on a tool to squeeze the single crystal, but it is placed on the support base held at approximately horizontal position. This contributes to the prevention of trouble such as inadvertent dropping of the single crystal during power suspension or due to failure in the support mechanism. In the above operating system, the support base can be simply moved or shifted in parallel movement, and there is no need to use strong force to squeeze the single crystal. This contributes to simplified and compact design of the apparatus. Therefore, the arm to move the support base is simply required to have strength to endure the weight of the single crystal, and there is no need to have rigidity for torque transmission for squeezing. This makes it possible to prepare the arm in lightweight and simplified structure. When the arm is moved freely with the constricted portion of the single crystal in supported state, the center of rotation of the support base is consistent with the axis of the single crystal, and this reduces the possibility of axial deviation of the single crystal caused by rotation during pulling operation.

Further, there are provided at least a driving unit of the seed crystal lift mechanism for holding the seed crystal and for moving it up and down and at least a driving unit of the single crystal support mechanism for supporting the constricted portion of the single crystal formed under the seed crystal, and these driving units are accommodated in a container, and this accommodation container is moved up and down. This makes it possible to pull up the single crystal having large diameter and heavy weight in reliable and safe manner. By designing the container in heat-insulation structure and by providing it with cooling function, it is possible to prevent adverse influence on the internal driving unit. If the power cable and the cable for control signal of the seed crystal lift mechanism and single crystal support mechanism are wound up in synchronization with the operation of the mechanism for winding up the wire, which suspends the accommodation container, these cables can be well arranged and do not cause trouble or hindrance to operation, and it is very convenient.

What is claimed is:

1. A single crystal pulling apparatus for manufacturing a semiconductor single crystal by pulling CZ (Czochralski) method, comprising:

a seed crystal lift mechanism for holding and moving a seed crystal up and down; and a single crystal support mechanism for supporting a constricted portion of a single crystal formed under said seed crystal, whereby:

said single crystal support mechanism comprises a support base for supporting a portion with larger diameter of said constricted portion from below in linear contact basis, having a through-hole to receive and pass said constricted portion and also having a slit for communicating said through-hole with outer peripheral portion of said support base to guide said constricted portion toward said through-hole.

2. A single crystal pulling apparatus according to claim 1, futher comprising means for moving said support base in a direction perpendicular to pulling direction of said single crystal so that said support base can be moved between a first position deviated from under the portion with larger diameter of said constricted portion and a second position under the portion with larger diameter of said constricted portion.

3. A single crystal pulling apparatus according to claim 1, wherein said support base has a recess approximately at the center.

4. A single crystal pulling apparatus according to claim 1, wherein said single crystal support mechanism comprises an arm member for supporting an end of said support base and a balance member for preventing deflection of the support mechanism due to rotation at an arm position before supporting.

5. A single crystal pulling apparatus according to claim 1, wherein width of said slit is larger than a diameter of the narrowest part of said constricted portion.

6. A single crystal pulling apparatus according to claim 1, further comprising:

an accommodation container for accommodating at least a driving unit of said seed crystal lift mechanism and at least a driving unit of said single crystal support mechanism; and an accommodation container lift mechanism for moving said accommodation container in vertical direction.

7. A single crystal pulling apparatus according to claim 6, further comprising a synchronized winding mechanism for winding up a power cable for driving said seed crystal lift mechanism in synchronization with upward or downward operation by said accommodation container lift mechanism.

8. A single crystal pulling apparatus according to claim 6, further comprising a synchronized winding mechanism for winding up a power cable for driving said single crystal gripping mechanism in synchronization with upward or downward operation by said accommodation container lift mechanism.

9. A single crystal pulling apparatus according to claim 6, further comprising a synchronized winding mechanism for winding up a power cable for control signal of said seed crystal lift mechanism in synchronization with upward or downward operation by said accommodation container lift mechanism.

10. A single crystal pulling apparatus according to claim 6, further comprising a synchronized winding mechanism for winding up a power cable for control signal of said single crystal gripping mechanism in synchronization with upward or downward operation by said accommodation container lift mechanism.

11. A single crystal support mechanism used in the manufacture of a semiconductor single crystal by pulling CZ method, whereby:

said support mechanism comprises a support base for supporting a portion with larger diameter of a constricted portion of the single crystal, said support base having a through-hole to receive and pass said constricted portion and having a slit for communicating said through-hole with outer peripheral portion of said support base to guide said constricted portion toward said through-hole.

12. A single crystal support mechanism according to claim 11, wherein said support base has a recess.

13. A single crystal support mechanism according to claim 12, wherein said recess is in tapered shape and is inclined at an angle of 10° to 70° with respect to a direction perpendicular to axial direction of said support base.

14. A single crystal support mechanism according to claim 1, wherein width of said slit is larger than a diameter of the narrowest part of said constricted portion.

15. A single crystal pulling method for manufacturing a semiconductor single crystal by pulling CZ method, whereby said method comprises the steps of:

immersing and adapting a seed crystal into a melt in a quartz crucible by a seed crystal lift mechanism;

forming a neck portion of the single crystal under said seed crystal by pulling said seed crystal using said seed crystal lift mechanism;

increasing diameter of said single crystal by controlling the pulling rate induced by said seed crystal lift mechanism to grow a spherical portion of the single crystal under said neck portion;

reducing diameter of said single crystal by controlling the pulling rate induced by said seed crystal lift mechanism to form a constricted portion under a spherical portion of said single crystal;

moving said support base in a direction approximately perpendicular to the axis of said constricted portion so that, using a support base having a through-hole to receive and pass said constricted portion and having a slit for communicating said through-hole with outer peripheral portion of said support base, said constricted portion is positioned in said through-hole via said slit; and forming a body portion of the single crystal under the portion with larger diameter of said constricted portion by pulling said support base in synchronization with said seed crystal lift mechanism.

* * * * *